(12) United States Patent
Lu et al.

(10) Patent No.: US 10,103,250 B2
(45) Date of Patent: Oct. 16, 2018

(54) METHOD OF FABRICATING SEMICONDUCTOR DEVICE

(71) Applicant: UNITED MICROELECTRONICS CORP., Hsin-Chu (TW)

(72) Inventors: Chia-Lin Lu, Taoyuan (TW); Chun-Lung Chen, Tainan (TW); Kun-Yuan Liao, Hsin-Chu (TW); Feng-Yi Chang, Tainan (TW); Wei-Hao Huang, New Taipei (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/677,029

(22) Filed: Aug. 15, 2017

(65) Prior Publication Data
US 2018/0012975 A1   Jan. 11, 2018

Related U.S. Application Data

(62) Division of application No. 14/919,716, filed on Oct. 21, 2015, now Pat. No. 9,773,890.

(30) Foreign Application Priority Data

Sep. 23, 2015 (TW) .............................. 104131396 A (51) Int. Cl.
| | | |
|---|---|---|
| H01L 29/66 | (2006.01) | |
| H01L 29/78 | (2006.01) | |
| H01L 29/417 | (2006.01) | |
| H01L 21/265 | (2006.01) | |
| H01L 21/768 | (2006.01) | |

(52) U.S. Cl.
CPC .. *H01L 29/66795* (2013.01); *H01L 21/26513* (2013.01); *H01L 21/76897* (2013.01); *H01L 29/41791* (2013.01); *H01L 29/785* (2013.01); *H01L 29/7848* (2013.01)

(58) Field of Classification Search
CPC ....................... H01L 29/41791; H01L 21/845
See application file for complete search history.

(56) References Cited

U.S. PATENT DOCUMENTS

| | | | |
|---|---|---|---|
| 6,548,394 B1 | 4/2003 | Peng et al. | |
| 8,461,649 B2 | 6/2013 | Tsao et al. | |
| 9,236,452 B2 | 1/2016 | Lim | |
| 2011/0006437 A1 | 1/2011 | Tsao | |
| 2014/0264632 A1* | 9/2014 | Richter | ............. H01L 29/66795 257/401 |
| 2015/0214319 A1* | 7/2015 | Li | ........................ H01L 29/4966 257/288 |
| 2016/0056262 A1 | 2/2016 | Ho | |

* cited by examiner

*Primary Examiner* — Moazzam Hossain
*Assistant Examiner* — Farun Lu
(74) *Attorney, Agent, or Firm* — Winston Hsu (57) ABSTRACT

A semiconductor device and a method of forming the same, the semiconductor device includes a fin shaped structure, a gate structure, an epitaxial layer, an interlayer dielectric layer, a first plug and a protection layer. The fin shaped structure is disposed on a substrate, and the gate structure is across the fin shaped structure. The epitaxial layer is disposed in the fin shaped structure, adjacent to the gate structure. The interlayer dielectric layer covers the substrate and the fin shaped structure. The first plug is formed in the interlayer dielectric layer, wherein the first plug is electrically connected to the epitaxial layer. The protection layer is disposed between the first plug and the gate structure.

7 Claims, 6 Drawing Sheets

METHOD OF FABRICATING SEMICONDUCTOR DEVICE

CROSS REFERENCE TO RELATED APPLICATIONS

This application is a Divisional of application Ser. No. 14/919,716 filed Oct. 21, 2015, and included herein by reference.

BACKGROUND OF THE INVENTION

1. Field of the Invention

The present invention relates to a semiconductor device and a method of forming the same, and more particularly, a semiconductor device having a plug structure and method of forming the same.

2. Description of the Prior Art

In recent years, the critical dimension (CD) in semiconductor processes becomes finer with the increasing miniaturization of semiconductor devices. However, as the CD of the semiconductor device is continuously shrunk, the integrated process of forming a semiconductor device having metal gate also faces more challenges and limitations.

As the semiconductor industry has progressed into nanometer technology process nodes in pursuit of highly integrated and high-speed operation, current techniques utilize miniaturized through holes and inter-layer dielectric layers to form a multilayered interconnected wiring structure to electrically connect a metal gate and source/drain regions of a transistor, thereby providing signal input/output pathways for the transistor. However, the current photoresist and lithography techniques are no longer qualified enough to support the currently integrated process while forming the metal gate and contact plug. For example, the position shift of the contact plug electrically connected to the source/drain regions easily occurs, which may directly penetrate the metal gate, thereby affecting the electrical performance of the entire device. For these reasons, how to efficiently improve the current structure of the semiconductor device, as well as the method of forming the same, has become an important task in this field.

SUMMARY OF THE INVENTION

It is one of the primary objectives of the present invention to provide a method of forming a semiconductor device having a plug structure, so as to improve the electrical performance of the entire semiconductor structure.

It is another one of the primary objectives of the present invention to provide a semiconductor device having a plug structure, in which a protection layer is disposed, thereby being able to improve the electrical performance of the entire semiconductor structure.

To achieve the purpose described above, the present invention provides a method of forming a semiconductor device including following steps. First of all, a substrate is provided, and the substrate includes a fin shaped structure formed thereon. Next, a gate structure is formed across the fin shaped structure. Then, an epitaxial layer is formed in the fin shaped structure, adjacent to the gate structure, and an interlayer dielectric layer is formed on the gate structure and the fin shaped structure. After that, a first opening is formed in the interlayer dielectric layer to expose the epitaxial layer. Finally, a protection layer is formed on sidewalls of the first opening, and a first plug is filled in the first opening.

To achieve the purpose described above, the present invention provides a semiconductor device including a fin shaped structure, agate structure, an epitaxial layer, an interlayer dielectric layer, a first plug and a protection layer. The fin shaped structure is disposed on a substrate, and the gate structure is across the fin shaped structure. The epitaxial layer is disposed in the fin shaped structure, adjacent to the gate structure. The interlayer dielectric layer covers the substrate and the fin shaped structure. The first plug is formed in the interlayer dielectric layer, wherein the first plug is electrically connected to the epitaxial layer. The protection layer is disposed between the first plug and the gate structure.

According to the above, the semiconductor device and the forming method thereof in the present invention include sequentially forming the germanium cap layer in the opening and the protection layer only on the sidewalls of the opening, right after forming the opening of exposing the source/drain regions. With such performance, the protection layer may protect the opening in the subsequent etching processes for forming other openings, so as to avoid the exposure of the sidewalls of the opening, and to further avoid damages to the sidewalls while etching the sacrificial materials filled in the opening. Also, the protection layer preferably has a proper thickness, for example being between about 10 angstroms to 15 angstroms, so as to effectively protect the sidewalls of the opening without affecting the formations of any other elements formed subsequently, like plug structure for example.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 11 are schematic diagrams illustrating a method of forming a semiconductor device according to a first embodiment of the present invention, in which:

DETAILED DESCRIPTION

To provide a better understanding of the present invention, preferred embodiments will be described in detail. The preferred embodiments of the present invention are illustrated in the accompanying drawings with numbered elements.

Figure 1:
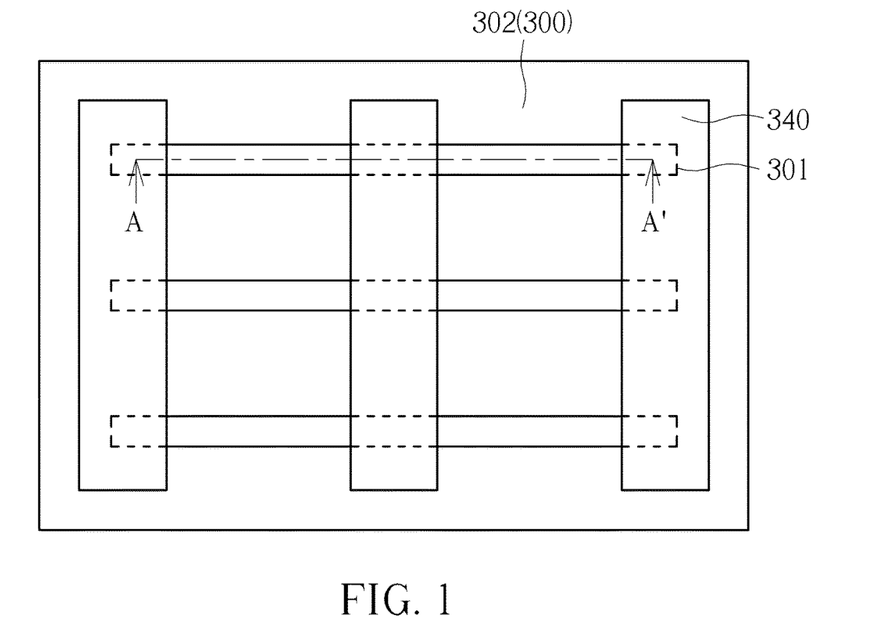
FIG. 1 shows a top view of a semiconductor device during the forming process.
Figure 2:
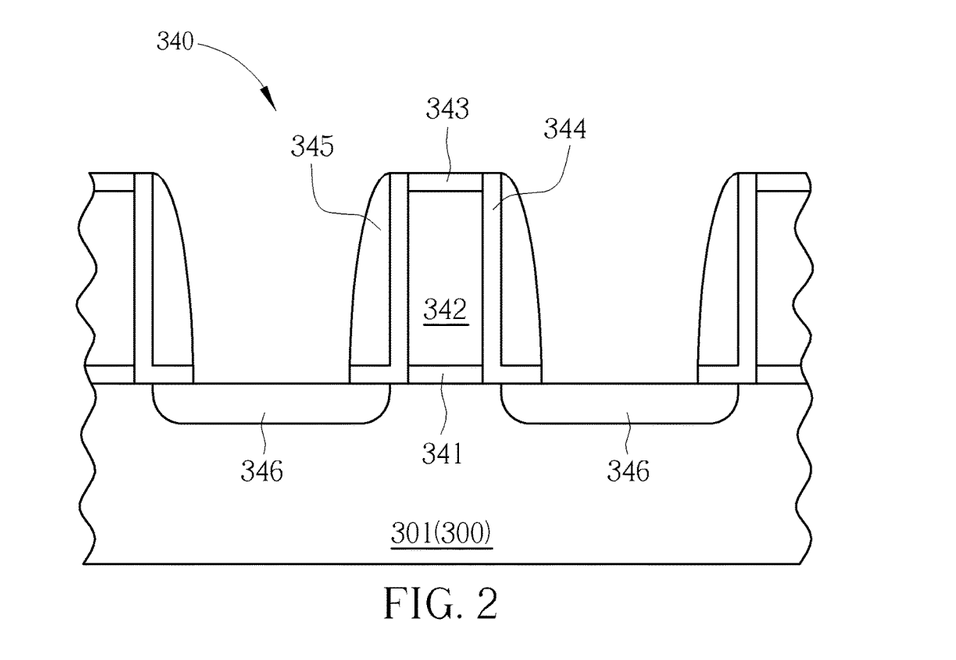
FIG. 2 shows a cross-sectional view taken along a cross line A-A' in FIG. 1.
Figure 4:
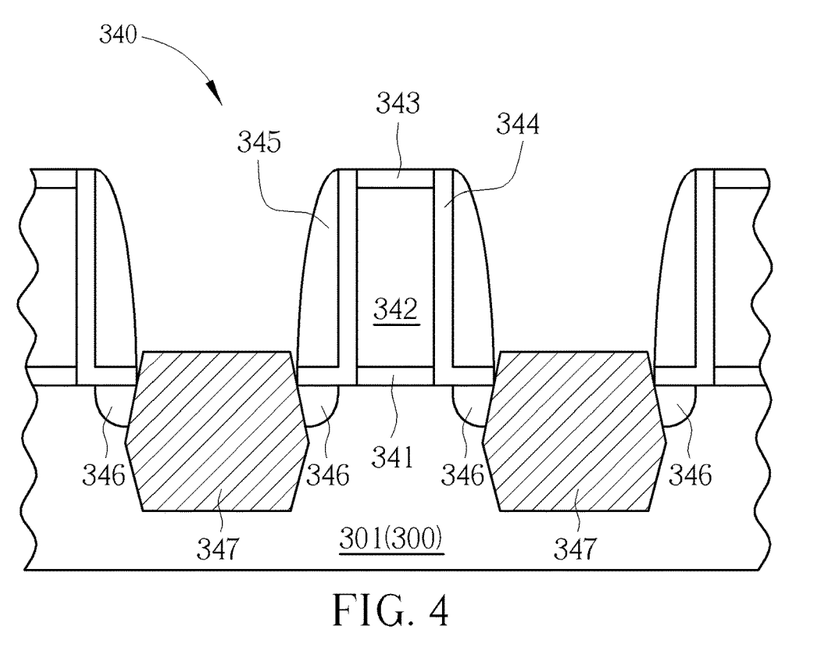
FIG. 4 shows a cross-sectional view of a semiconductor device during the forming process.
Figure 5:
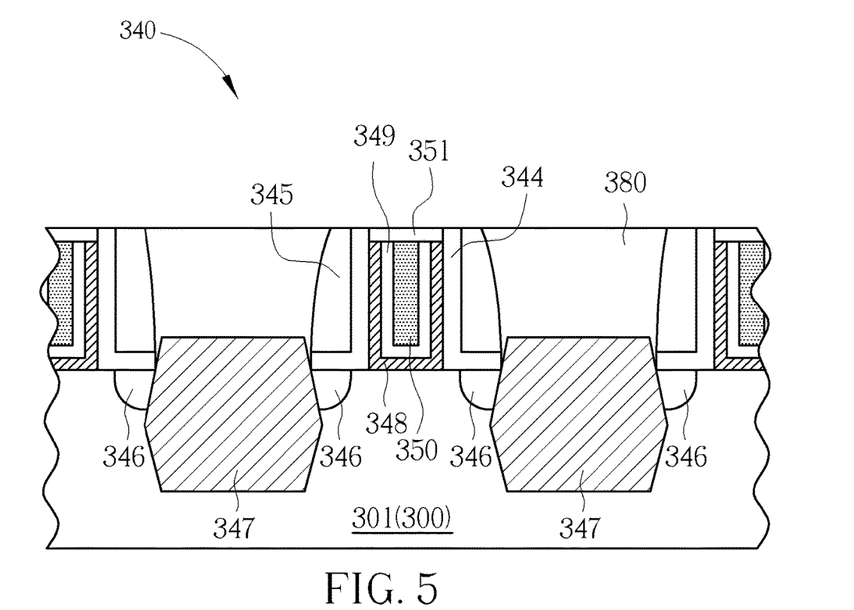
FIG. 5 shows a cross-sectional view of a semiconductor device during the forming process.
Figure 6:
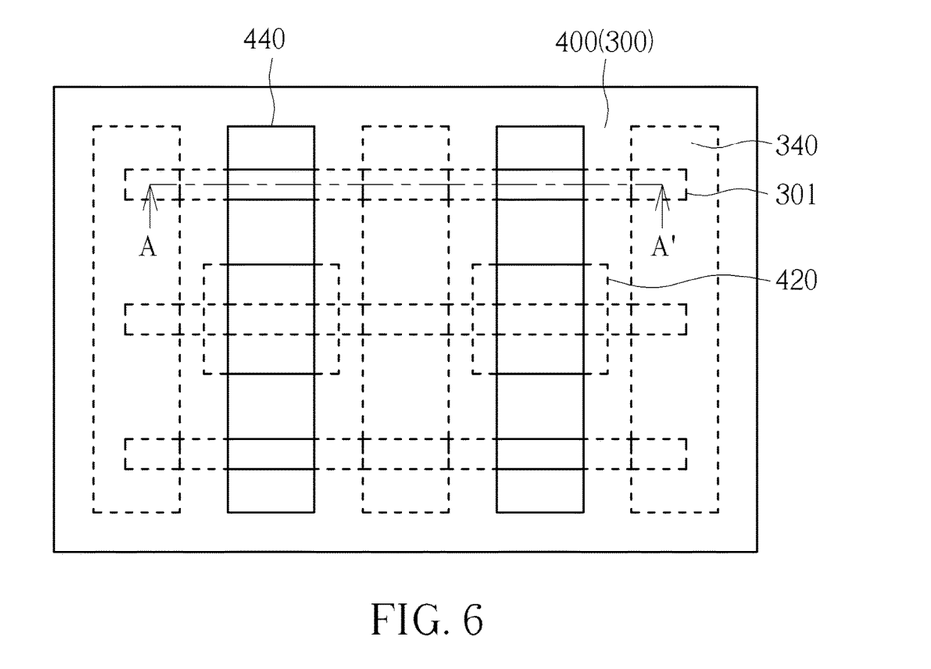
FIG. 6 shows a top view of a semiconductor device during the forming process.
Figure 7:
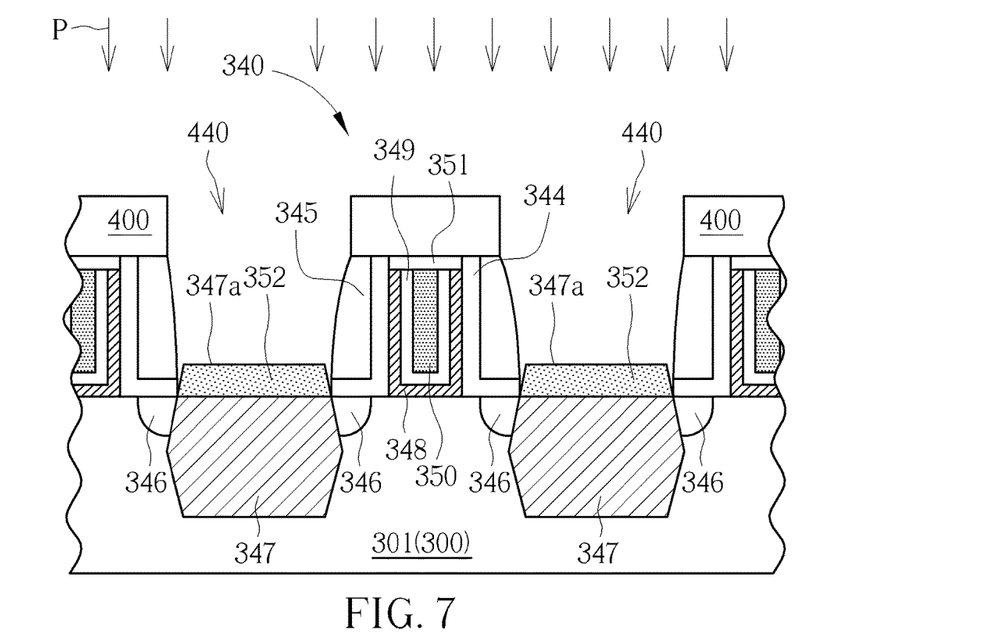
FIG. 7 shows a cross-sectional view taken along a cross line A-A' in FIG. 7.
Figure 8:
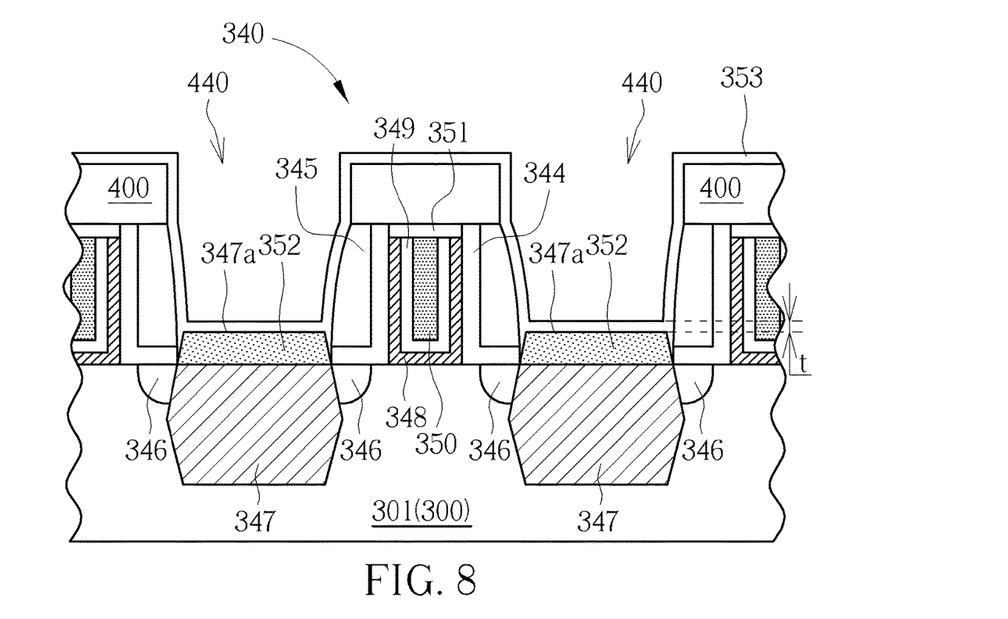
FIG. 8 shows a cross-sectional view of a semiconductor device during the forming process.
Figure 9:
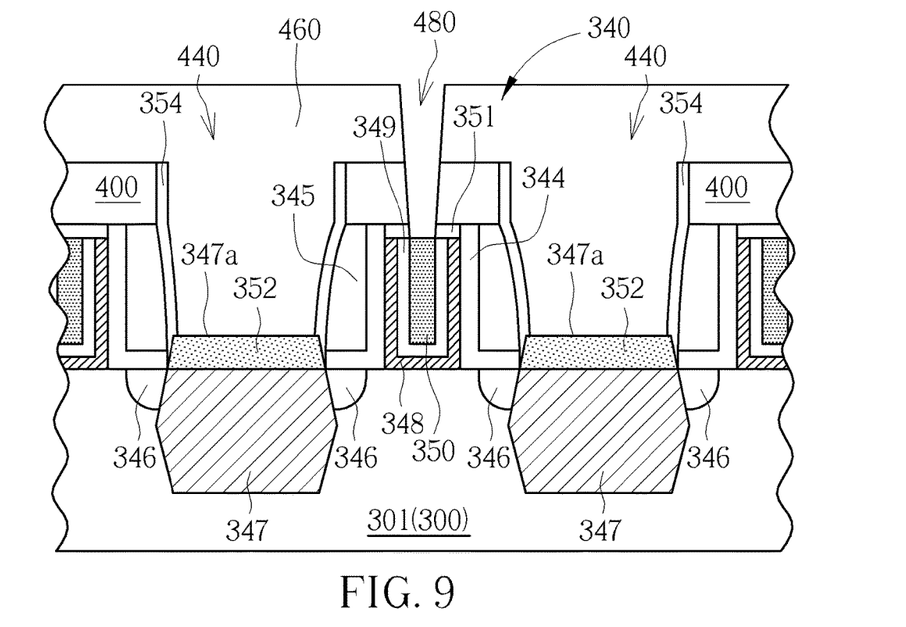
FIG. 9 shows a cross-sectional view of a semiconductor device during the forming process.
Figure 10:
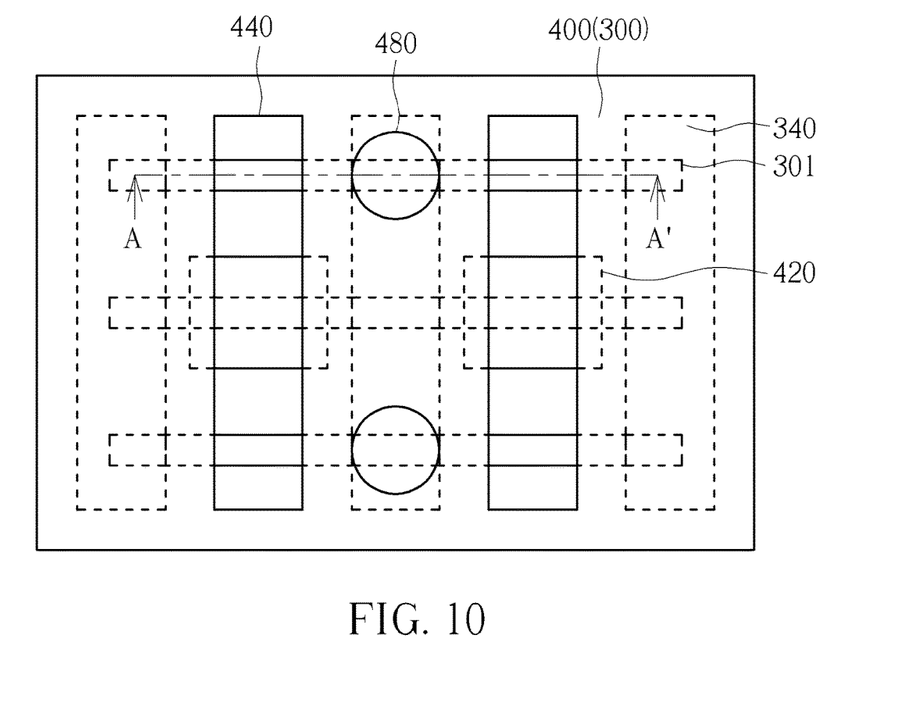
FIG. 10 shows a top view of a semiconductor device during the forming process.
Figure 11:
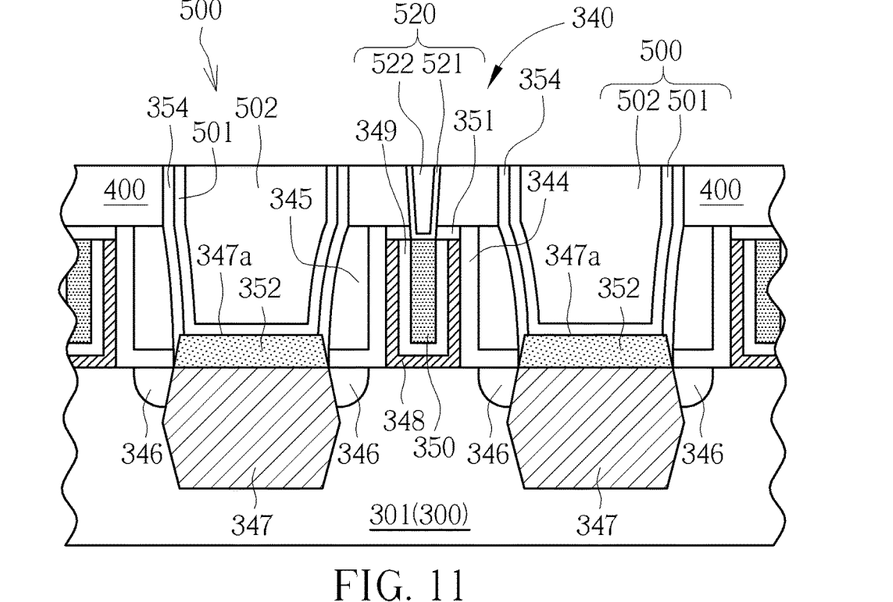
FIG. 11 shows a cross-sectional view taken along a cross line A-A' in FIG. 10.

Please refer to FIG. 1 to FIG. 11, which schematically illustrate a method of forming a semiconductor device in accordance with a first embodiment of the present invention, wherein FIG. 1, FIG. 6 and FIG. 10 show top views of the semiconductor device in forming steps, and FIG. 2, FIG. 7 and FIG. 11 show cross-sectional views taken along a cross line A-A' in FIG. 1, FIG. 6 and FIG. 10. Firstly, a substrate 300 is provided, like a silicon substrate, epitaxial silicon substrate, silicon germanium substrate, silicon carbide substrate or silicon on insulation (SOI) substrate, for example. Also, at least one fin shaped structure 301 may be formed on the substrate 300, and at least one gate structure 340 is formed across the fin shaped structure 301. Please note that, although the present embodiment is exemplified by forming three fin shaped structures 301, the number of the fin shaped structure 301 is not limited thereto, and may be further adjusted according to the practical requirements. For example, in another embodiment one or more than one fin shaped structure 301 may also be formed on the substrate 300.

Precisely, the formation of the fin shaped structure 301 may include a general photolithographic etching pattern (PEP) process or a multi-patterning process, preferably through a spacer self-aligned double-patterning (SADP) process, also known as sidewall image transfer (SIT) technique, to form a plurality of shallow trenches (not shown in the drawings) in the substrate 300. Then, an insulating layer may be filled in the trenches, so that, a portion of the substrate 300 may protrude from the insulating layer to form the fin shaped structure 301 and the insulating layer may form shallow trench isolations (STI) to surround the fin shaped structure 301, as shown in FIG. 1. However, the forming method of the fin shaped structure 301 in the present invention is not limited thereto, and in another embodiment of the present invention, the formation of the fin shaped structures 301 may also be accomplished by first forming a patterned hard mask (not shown in the drawings) on the substrate 300, and then performing an epitaxial process on the exposed substrate 300 through the patterned hard mask to form a semiconductor layer (not shown in the drawings), such as silicon or silicon germanium layer, thereby being used as the corresponding fin shaped structure. Otherwise, in another embodiment, the fin shaped structure may also be omitted, and a gate structure (not shown in the drawings) may be formed directly on a planar substrate (not shown in the drawings).

Turning next, the gate structure 340 is formed on the substrate 300. In one embodiment, the gate structure 340 includes a gate dielectric layer 341, a dummy gate 342, a capping layer 343, a liner 344, a spacer 345 and a light doped drain (LDD) region 346. The gate dielectric layer 341 may include silicon oxide or silicon nitride (SiN). The dummy gate 342 may include polysilicon, for example including undoped polysilicon, doped polysilicon, amorphous silicon or a composite material of the combination thereof. The capping layer 343 may include a multilayer structure, as shown in FIG. 2, for example including silicon dioxide ($SiO_2$), silicon carbide (SiC), SiN, oxynitride (SiON) or a composite material of the combination thereof, and in another embodiment, the capping layer 343 may also be a monolayer of the above mentioned materials, however. The liner 344 may include silicon oxide. The spacer 345 may also include a monolayer structure or a multilayer structure optionally, for example including high temperature oxide (HTO), SiN, silicon oxide, SiON or SiN formed by hexachlorodisilane ($Si_2Cl_6$) (HCD-SiN), but is not limited thereto.

Precisely speaking, in one embodiment of the present invention, the method of forming the gate structure 340 may include the following steps. First of all, a gate dielectric material layer (not shown in the drawings), a dummy gate material layer (not shown in the drawings) and a capping material layer (not shown in the drawings) are sequentially stacked on the substrate 300, and then the stacked layers are patterned to form a gate stack structure (not shown in the drawings). Then, the liner 344 is formed at sidewalls of the gate stack structure, the LDD region 346 is formed in the fin shaped structure 301 (substrate 300) at two sides of the gate stack structure, and the spacer 345 is finally formed on sidewalls of the liner 344, thereby forming the gate structure 340.

Figure 3:
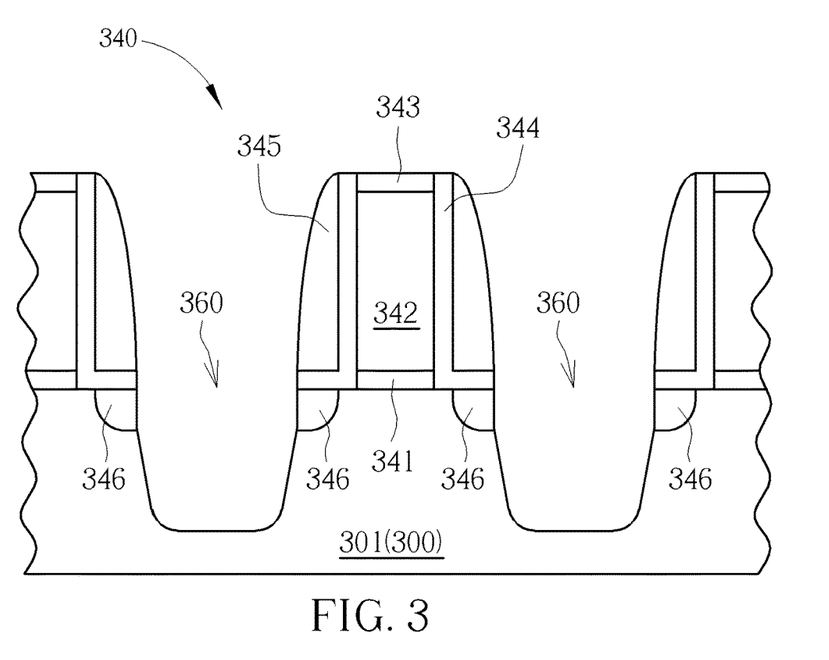
FIG. 3 shows a cross-sectional view of a semiconductor device during the forming process.

Subsequently, an epitaxial layer 347 is formed in the fin shaped structure 301, at two sides of the gate structure 340, being adjacent to the gate structure 340 to function like source/drain regions. Precisely, an etching process, like a dry etching process, a wet etching process or a sequentially performed dry and wet etching process for example, is firstly performed to form a recess 360 in the fin shaped structure 301, at two sides of the gate structure 340, as shown in FIG. 3. Then, a selective epitaxial growth (SEG) process is performed to form an epitaxial layer 347 in the recess 360, as shown in FIG. 4.

In the present embodiment of the present invention, the material of the epitaxial layer 347 may be adjusted according to the type of the MOS transistor formed in the subsequent steps. For example, when the MOS transistor is a PMOS, the epitaxial layer 347 may include silicon germanium (SiGe), silicon-germanium-boron (SiGeB), or silicon-germanium-tin (SiGeSn). Also, a P type dopant may be in-situ implanted into the epitaxial layer 347 during the SEG process, to form a $P^+$ epitaxial layer thereby, such that, the following ion implantation process for forming the source/drain of PMOS may be omitted. On the other hand, in another embodiment of the present invention, when the MOS transistor is NMOS, the epitaxial layer 347 may include silicon carbide (SiC), silicon carbide-phosphate (SiCP), or silicon phosphate (SiP). Likewise, an N type dopant may also be in-situ implanted into the epitaxial layer 347 during the SEG process, to form an $N^+$ epitaxial layer thereby, but is not limited thereto. However, in one embodiment, an additional ion implantation process may be performed, to form the source/drain in the epitaxial layer 347 either before or after the epitaxial layer 347 is formed. In another embodiment, the dopants or heterogeneous atoms, like germanium or carbon atoms for example, may be altered in a gradual arrangement; or the epitaxial layer may be omitted, to directly perform the ion implantation process in the fin shaped structure 301 or the substrate 300, at two sides of the gate structure 340, to directly form source/drain regions (not shown in the drawings) in the fin shaped structure 301 or the substrate 300 thereby.

Following these, after forming an interlayer dielectric (ILD) layer 380 on the substrate 300, a replacement metal gate (RMG) process is performed to replace the dummy gate 342 of the gate structure 340 with a metal gate. In the present embodiment, the method of forming the metal gate may include entirely forming an interlayer dielectric material layer (not shown in the drawings), such as a silicon oxide layer, on the substrate 300, to completely cover the gate structure 340. Then, a planarization process is carried out, such as a chemical mechanical polish (CMP) process, an etching back process or a combination of both, to remove a portion of the interlayer dielectric material layer up to the exposure of the gate structure 340, and to remove a portion of the liner 344, a portion of the spacer 345, and the capping layer 343, to form the ILD layer 380 thereby.

Subsequently, the dummy gate 342 and the gate dielectric layer 341 are removed by using a selective dry etching or wet etching, to form a gate recess (not shown in the drawings). Finally, a high dielectric constant (high-k) layer (not shown in the drawings), a work function metal material layer (not shown in the drawings) and a low-resistance metal material layer (not shown in the drawings) are sequentially formed in the gate recess, and another CMP process is carried out to remove the above-mentioned layers that are outside the gate recess, thereby forming a gate dielectric layer (not shown in the drawings), a work function metal layer (not shown in the drawings), and a metal layer (not shown in the drawings). Finally, an etching back process is performed, to remove a portion of the gate dielectric layer, a portion of the work function metal layer, and a portion of the metal layer, and to form a gate dielectric layer 348, a work function metal layer 349 and a metal layer 350, as shown in FIG. 5. Then, a capping layer 351 is formed.

However, the metal gate of the present invention is not limited to being formed through the above-mentioned steps, and may include other forming methods which are well known by one skilled in the art. For example, in one embodiment of the present invention, a bottom barrier material layer (not shown in the drawings), like a titanium/titanium nitride (Ti/TiN) layer or a tantalum/tantalum nitride (Ta/TaN) layer for example, may be further formed between the high dielectric constant layer and the work function metal material layer; or a top barrier material layer (not shown in the drawings) substantially including similar materials as that of the bottom barrier material layer, may be further formed between the work function metal material layer and the low-resistance metal material layer, but not limited thereto. The bottom barrier material layer and the top barrier material layer may form a bottom barrier layer (not shown in the drawings) and/or a top barrier layer (not shown in the drawings) only disposed in the gate trench also through the CMP process.

Additionally, in one embodiment of the present invention, the gate dielectric layer 348 for example includes a high dielectric constant (high-k) material, like hafnium oxide ($HfO_2$), hafnium silicon oxide ($HfSiO_4$) or hafnium silicon oxynitride (HfSiON); and the work function metal layer 349 is preferably configured to adjust the work function of the metal gate and the material thereof may be adjusted according to the type of the MOS transistor. For example, when the MOS transistor is NMOS, the work function metal layer 349 may include metal materials having a work function being between 3.9 eV and 4.3 eV, such as TiAl, ZrAl, WAl, TaAl, HfAl or TiAlC, but not limited thereto; or when the MOS transistor is PMOS, the work function metal layer 349 may include metal materials having a work function being between 4.8 eV and 5.2 eV, such as TiN, TaN, or TaC, but not limited thereto. The metal layer 350 may include aluminum (Al), Ti, Ta, or tungsten (W), but not limited thereto.

Furthermore, the gate structure 340 of the present invention is not limited to being formed through the above-mentioned steps, and may include other methods which are well known by one skilled in the art. For example, in one embodiment of the present invention, a monolayer or multi-layer contact etch stop layer (CESL, not shown in the drawings) may be optionally formed on the substrate 300, before the interlayer dielectric material layer is formed, for further providing required compressive stress or tensile stress to the channel of the gate structure 340. Meanwhile, although the gate structure 340 of the present embodiment is exemplified as a "gate-last" process and a "high-k last" process, in another embodiment, the gate structure may also be formed through a "gate-first" process or a "high-k first" process, or a metal gate structure (not shown in the drawings) may also be directly formed on the substrate, wherein the metal gate structure at least includes a work function metal layer (not shown in the drawings) and a metal gate (not shown in the drawings). Otherwise, when the primary gate structure may be adequate for the product requirements, the replacement metal gate process may also be omitted optionally.

Following these, a contact opening etching process is carried out. Precisely, an interlayer dielectric (ILD) layer 400 is firstly formed on the ILD layer 380, and the ILD layer 400 may include the same material as the ILD layer 380 or other suitable dielectric materials. Then, at least one contact opening 440 is formed in the ILD layer 400 and the ILD layer 380 to expose the epitaxial structure 347 (namely, the source/drain regions) underneath. The contact opening etching process may be performed through a photolithographic etching process, for example including firstly forming a slot cut pattern 420 and a patterned photoresist layer (not shown in the drawings) partially overlapping the slot cut pattern 420 on the ILD 400, and performing an etching process by simultaneously using the slot but pattern 420 and the patterned photoresist layer as a mask, to remove a portion of the ILD 400 and the ILD 380 at the two sides of the gate structure 340, thereby forming a plurality of openings 440 to expose the epitaxial layer 347 (namely, the source/drain region), as shown in FIG. 6. It is worth noting that, in the present embodiment, the slot cut pattern 420 is disposed right across below at least one opening pattern of the patterned photoresist layer, and partially overlaps the openings 440 in a projection direction, so that, the slot cut pattern is able to divide the opening 440 into two parts, as shown in FIG. 6.

It is also worth noting that, the openings 440 of the present embodiment preferably include a greater diameter, such that, the spacers 345 and a top surface 347a of the epitaxial layer 347 (namely, the source/drain region) may be completely exposed thereby, as shown in FIG. 7. In other words, the openings 440 are actually defined by the spacers 345 and the top surface 347a of the epitaxial layer 347. Then, a cleaning process may be carried out optionally, to remove the residue of the aforementioned photolithographic etching process remaining in the openings 440.

After that, another ion implantation process, such as a pre-amorphous implantation (PAI) process, may be performed, to implant a proper dopant in at least a portion of the epitaxial layer 347 (namely, the source/drain regions), wherein the dopant preferably include a dopant having a relative greater crystal lattice than silicon, such as germanium, but is not limited thereto. In other words, a cap layer, like a germanium cap layer 352 is formed at least in a portion of the epitaxial layer 347 (namely, the source/drain regions), preferably in at least the top portion or the whole of the epitaxial layer 347, as shown in FIG. 7. It is noted that, the germanium cap layer 352 is formed for protecting the epitaxial layer 347 (namely, the source/drain regions), so as to prevent the epitaxial layer 347 from receiving any damage in the subsequent process, like a plug forming process for example. Also, in another embodiment, the dopant may also be altered in a gradual arrangement.

Then, a protection material layer 353 is formed on the substrate 300 and the fin shaped structure 301, to entirely cover the top surface of the ILD layer 400 and sidewalls and a bottom wall of the opening 400, as shown in FIG. 8. In one embodiment, the protection material layer 353 may include a monolayer or a multilayer structure, preferably including an insulating material, like SiN or SiCN for example, but is not limited thereto. Please note that, in order to avoid any interference to the subsequent process, like a plug forming process for example, caused by such protection material layer 353, the protection material layer 353 preferably includes a relative small thickness t, substantially being between 10 angstroms (Å) to 15 angstroms, as shown in FIG. 8, but is not limited thereto.

Following these, an etching back process is performed, for example through a dry etching process, a wet etching process or a sequentially performed dry and wet etching process, to remove the protection material layer 353 disposed on the top surface of the ILD layer 400 and the bottom wall of the openings 440, so that, a protection layer 354 may be formed only on the sidewalls of the openings 440, as shown in FIG. 9. It is worth noting that, the protection layer 354 directly contacts the spacer 345. Next, another contact opening etching process is carried out, to form an opening 480 in the ILD layer 400 to expose the gate structure 340 underneath. Precisely, a patterned sacrificial mask layer 460 having an opening pattern is formed on the ILD layer 400, to fill in the openings 440, and an etching process is carried out to remove a portion of the ILD layer 400 and a portion of the capping layer 351 of the gate structure 340, to form the opening 480 thereby, as shown in FIG. 9.

Finally, after completely removing the patterned sacrificial mask layer 460, a cleaning process may be optionally performed, for example, using argon (Ar) to clean surfaces where the openings 440, 480 are formed, for removing the etching residue, and a plug process is carried out, to form plugs 500, 520 which are electrically connected to the epitaxial layer 347 (namely, the source/drain regions) and the gate structure 340 in the openings 440, 480, respectively.

It is noted that, the method of partially removing the protection material layer 353 is not limited to being performed by using the aforementioned etching back process, and may optionally include other processes. For example, in another embodiment, the aforementioned etching back process may be omitted, and the protection material layer 353 disposed on the top surface of the ILD layer 400 and the bottom wall of the openings 440 may be removed by argon while the cleaning process of the opening 480 is performed. In this way, the protection layer 354 only disposed on the sidewalls of the openings 440 may also be formed.

After such cleaning process, a silicidation process may be performed in the openings 440. Then, the plug process is performed, to form the plugs 500, 520 electrically connected to the epitaxial layer 347 (namely, the source/drain regions) and the gate structure 340 in the openings 440, 480, respectively. The formation of the plugs 500, 520 for example includes firstly forming a barrier material layer (not shown in the drawings) and a metal material layer (not shown in the drawings) in the openings 440, 480, and performing a planarization process, like a CMP process, an etching process or a combination of both for example, to remove a portion of the metal material layer and a portion of the barrier material layer to simultaneously form the plugs 500, 520 thereby. In this manner, the plugs 500, 520 may be level with the top surface of the ILD layer 400, and include barrier layers 501, 502 and contact metal layers 502, 522, respectively, as shown in FIG. 11. It is noted that, the plug 500 may directly contact the entire protection layer 354 and the plug 520 may directly contact the ILD layer 400. Furthermore, in one embodiment of the present invention, the barrier layers 501, 521 may include a titanium layer, titanium nitride layer, tantalum layer or tantalum nitride layer; and the contact metal layer 502, 522 may include tungsten or metal having lower resistance, but not limited thereto.

Through the aforementioned steps, the semiconductor device according to the first embodiment of the present invention is provided. The method of the present invention sequentially forms the germanium cap layer in the opening and the protection layer on the sidewalls of the opening, right after forming the opening of exposing the source/drain region. With such performance, the protection layer may protect the opening in the subsequent etching processes for forming other openings, so as to avoid the exposure of the sidewalls of the opening, and to further avoid damage to the sidewalls while etching the sacrificial materials filled in the opening. Please note that, the protection layer preferably has a proper thickness, for example being between about 10 angstroms to 15 angstroms, so that, the protection layer may effectively protect the sidewalls of the opening without affecting the formations of any other elements formed subsequently, like plug structure for example.

People skilled in the art shall easily realize that the semiconductor device of the present invention is not limited to being formed through the aforementioned steps, and may include other forming methods. Thus, the following description will detail other different embodiments or variant embodiments of the manufacturing method of the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 12:
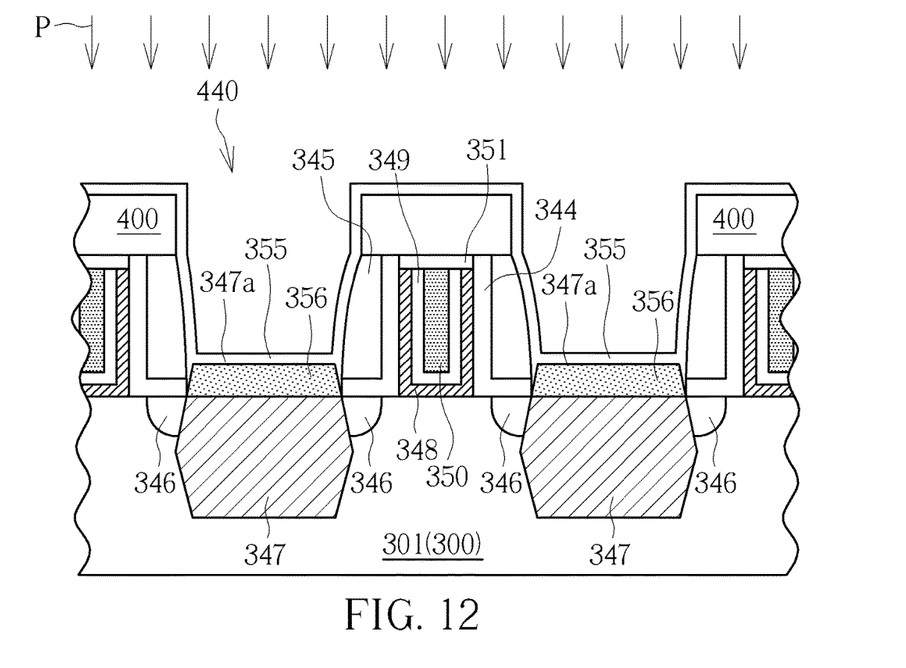
FIG. 12 is a schematic diagram illustrating a method of forming a semiconductor device according to a second embodiment of the present invention.

Please refer to FIG. 12, which is a schematic diagram illustrating a manufacturing method of a semiconductor device according to the second embodiment of the present invention. The formal steps in the present embodiment are similar to those in the aforementioned first embodiment, including sequentially forming the fin shaped structure 301, the gate structure 340, the epitaxial layer 347 (namely, the source/drain regions) and the openings 440 either on the substrate 300 or in the substrate 300. Also, it is noted that, the detailed forming methods and materials of the fin shaped structure 301, the gate structure 340, the epitaxial layer 347 and the openings 440 in the present embodiment may be substantially similar to those in the aforementioned first embodiment or be well known in the art, and may not be redundantly described herein.

The differences between the present embodiment and the aforementioned first embodiment are that, after forming the openings 440, the forming process of a protection material layer 355 is firstly carried out. In other words, in the present embodiment, the protection material layer 355 which directly contacts the epitaxial layer 347 (namely, the source/drain regions) may be formed, and then the pre-amorphous implantation process P is performed, such that, the subsequent ion implantation process may be performed by using the protection material layer 355 as a buffering layer, to implant a proper dopant, such as germanium, in at least a portion of the epitaxial layer 347, and a cap layer, like a germanium cap layer 356 for example, is formed at least in a top portion of the epitaxial layer 347 thereby, as shown in FIG. 12.

Following these, the forming process shown in FIGS. 8-11 of the aforementioned first embodiment may be continuously performed, and the semiconductor device according to the second embodiment of the present invention may be obtained thereby, as shown in FIG. 12. In the present embodiment, the protection material layer is formed before the germanium cap layer is formed, and then, the protection material layer disposed on the ILD layer and the bottom wall of the opening is removed, so as to achieve the purpose of protecting the opening. In this manner, the protection layer formed accordingly may be able to avoid the exposure of the sidewalls of the opening, and to further avoid damage to the sidewalls while etching the sacrificial materials filled in the opening.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device comprising:
    providing a substrate having a fin shaped structure formed thereon;
    forming a gate structure across the fin shaped structure;
    forming an epitaxial layer in the fin shaped structure adjacent to the gate structure;
    forming an interlayer dielectric layer on the gate structure and the fin shaped structure;
    forming a first opening in the interlayer dielectric layer to expose the epitaxial layer;
    forming a protection layer on sidewalls of the first opening;
    after forming the protection layer, performing an implantation process on the epitaxial layer; and
    forming a first plug filled in the first opening.

2. The method of forming the semiconductor device according to claim 1, wherein the first plug directly contacts the protection layer.

3. The method of forming the semiconductor device according to claim 1, wherein the forming of the protection layer comprises:
    forming a protection material layer covering the sidewalls and a bottom wall of the first opening; and
    removing the protection material layer on the bottom wall of the first opening.

4. The method of forming the semiconductor device according to claim 3, further comprising:
    forming a second opening in the interlayer dielectric layer to expose the gate structure, wherein the protection material layer on the bottom wall of the first opening is removed after the second opening is formed.

5. The method of forming the semiconductor device according to claim 4, further comprising:
    forming a second plug in the second opening while the first plug is formed.

6. The method of forming the semiconductor device according to claim 5, wherein the second plug directly contacts the interlayer dielectric layer.

7. The method of forming the semiconductor device according to claim 1, further comprising:
    forming a spacer surrounding the gate structure, wherein the spacer is exposed from the first opening and the protection layer directly contacts the spacer.

* * * * *